United States Patent
Kato et al.

(10) Patent No.: US 7,373,879 B2
(45) Date of Patent: May 20, 2008

(54) SCREEN PRINTING APPARATUS

(75) Inventors: Kazumi Kato, Aichi (JP); Masamichi Wada, Aichi (JP)

(73) Assignee: Sony Corporation (JP)

( * ) Notice: Subject to any disclaimer, the term of this patent is extended or adjusted under 35 U.S.C. 154(b) by 7 days.

(21) Appl. No.: 10/563,304

(22) PCT Filed: Aug. 16, 2004

(86) PCT No.: PCT/JP2004/011753

§ 371 (c)(1),
(2), (4) Date: May 18, 2006

(87) PCT Pub. No.: WO2005/018935

PCT Pub. Date: Mar. 3, 2005

(65) Prior Publication Data

US 2006/0272521 A1    Dec. 7, 2006

(30) Foreign Application Priority Data

Aug. 22, 2003   (JP) ............................. 2003-299267

(51) Int. Cl.
*B41L 13/18* (2006.01)
(52) U.S. Cl. .................. 101/123; 101/124; 101/114
(58) Field of Classification Search ............... 101/114, 101/123, 124, 126, 129
See application file for complete search history.

(56) References Cited

U.S. PATENT DOCUMENTS 5,503,067 A * 4/1996 Jaffa ........................... 101/123
6,142,070 A * 11/2000 Hoffman et al. ............ 101/123

FOREIGN PATENT DOCUMENTS

| JP | 07-178887 | 7/1995 |
|---|---|---|
| JP | 08-39766 | 2/1996 |
| JP | 08-207243 | 8/1996 |
| JP | 11-245376 | 9/1999 |
| JP | 2000-136678 | 5/2000 |
| JP | 2001-287337 | 10/2001 |
| JP | 2003-25544 | 1/2003 |

OTHER PUBLICATIONS

International Search Report dated Sep. 21, 2004.

* cited by examiner

*Primary Examiner*—Ren Yan
(74) *Attorney, Agent, or Firm*—Rader Fishman & Grauer PLLC; Ronald P. Kananen

(57) ABSTRACT

Disclosed is a screen printing apparatus for screen printing the cream solder including a squeegee assembly (30) provided with comb blade members (35) and with solder leakage prohibiting guides (36). The comb blade members partition a cream solder (52) substantially vertically with respect to a contact slide surface between the squeegee (33) and the screen (21) to prevent the cream solder from passing in fluidity on the screen (21) in a direction substantially at right angles to the sliding direction as the squeegee sweeps and as the cream solder becomes twisted between the screen and the squeegee. The solder leakage prohibiting guides (36) prevent the cream solder from leaking to outside a printing sphere determined by the squeegee width.

4 Claims, 11 Drawing Sheets

SCREEN PRINTING APPARATUS

TECHNICAL FIELD

This invention relates to a screen printing apparatus. More particularly, it relates to a screen printing apparatus in which, in screen printing cream solder, it is possible to prevent part of the cream solder from flowing substantially at right angles to the moving direction of a squeegee to leak out from both ends of the squeegee.

The present invention contains subject matter related to Japanese Patent Application JP 2003-299267 filed in the Japanese Patent Office on Aug. 22, 2003, the entire contents of which are incorporated herein by reference.

BACKGROUND ART

When mounting electronic components on a circuit substrate, in assembling an electronic circuit, a technique is used which comprises bonding a copper foil to the surface of a substrate of an insulating material, as a circuit substrate, forming a preset interconnect pattern by etching, mounting electronic components thereon, and soldering electrodes or terminals for the electronic components to lands for connection of the interconnect pattern of the circuit substrate. For connecting the electrodes of these electronic components to the lands for connection of the circuit substrate, cream solder is used.

That is, cream solder is printed and deposited at preset positions on the surface of the circuit substrate, provided with electrical interconnections, using the technique of screen printing. The electronic components are mounted in position thereon, and the circuit substrate, having the electronic components loaded thereon, is introduced into a reflow furnace. The cream solder is melted by heat in the reflow furnace, whereby the electrodes of the electronic components are soldered to the lands for connection of the circuit substrate. Thus, for the manufacture of the electronic circuit, it is necessary to provide a screen printing apparatus for applying the cream solder on the circuit substrate by the screen printing technique.

An example of such a screen printing apparatus will now be explained with reference to FIGS. 1 and 2. A conventional screen printing apparatus 100 includes a squeegee assembly 110, in which a squeegee 104 is mounted to a squeegee holder 101 by a squeegee retainer 106, and in which a solder leakage guide 102 is mounted on both ends of the squeegee to the squeegee holder 101. In printing a cream solder 105, a printing substrate 107 is contacted with the back surface of a screen 103 and subsequently the squeegee assembly 110 is caused to descend to compress the squeegee 104 against the screen 103. The squeegee assembly is actuated along the direction of printing to cause the squeegee 104 to slide on the screen 103, in order to print the cream solder 105, lying on the screen 103, onto the screen 103. The cream solder 105 is charged in a printing opening area in the screen 103 and printed on the printing substrate 107. It is noted that the printing opening area is an opening formed in the screen for printing the cream solder 105 on the printing substrate 107.

Since the cream solder 105 is high in viscosity, it becomes twisted between the screen 103 and the squeegee 104, as the squeegee 104 sweeps during the printing. The cream solder flows in a direction along arrow G in FIG. 1, perpendicular to the moving direction, as the cream solder is rolled along the printing direction on the printing substrate 107, with the cream solder then leaking out to outside the width of the squeegee, along the direction of an arrow H in FIG. 1, that is, to outside the printing area. The solder leakage guide 102 is provided for preventing the cream solder 105 from leaking to outside the printing area. Other measures for combating the leakage are taken, such as providing a mechanism for raking the cream solder towards the inner side on both ends of the squeegee, for reducing the amount of the cream solder 105 extruded and discharged from both ends of the squeegee during the squeegee driving, or providing an enlarged portion extending laterally from the squeegee. Examples of these measures for preventing leakage of the cream solder are disclosed in the JP Patent Laid-Open Publication JP-Hei-8-39766 (Patent publication 1) and the JP Patent Laid-Open Publication JP-2000-136678 (Patent publication 2).

As means mounted to both ends of the squeegee for prohibiting solder leakage there are known a guide for contacting the solder leakage guide 102 to the screen 103 and a guide for providing a certain clearance between the solder leakage guide 102 and the screen 103. However, as the number of printed paper sheets is increased, it can hardly be avoided that the cream solder 105 becomes twisted between the screen 103 and the squeegee 104 and extruded to outside the squeegee to leak out from the solder leakage guide 102.

Moreover, with the technique disclosed in Patent Publication 1, the squeegee itself becomes complex in structure to raise the cost. In addition, with this technique, there is a risk that, when the squeegee 104 is uplifted on the termination of printing, the solder becomes affixed, as at 108, to the inner lateral side of the solder leakage guide 102, as shown in FIG. 3, this affixed solder 108 being then clinched between the solder leakage guide 102 and the screen 103 to leak to outside the printing area, as leakage solder 109, when the squeegee 104 is lowered for the next printing. The affixed solder 108, affixed to the solder leakage guide 102, and the leakage solder 109, leaked from the guide, become oxidized and unusable with the lapse of time and hence, are discarded. This discarded solder leads to a raised production cost and a wastage of resources, while raising significant pollution problems if the processing for disposal is taken into account.

DISCLOSURE OF THE INVENTION

It is an object of the present invention to provide a novel screen printing apparatus free of the above described deficiencies of the conventional screen printing apparatus.

It is another object of the present invention to provide a screen printing apparatus in which, in screen printing a paste-like coating agent, it is possible to prevent part of the coating agent from flowing at right angles to the sweep direction of the squeegee to leak out from both ends of the squeegee to outside the printing sphere.

The present invention provides a screen printing apparatus in which a squeegee mounted at an angle to the sliding direction is slid on a screen to force a paste-like coating agent, supplied on the screen, to a substrate provided in contact with the underside of the screen, via an opening formed in the screen. The apparatus comprises at least one partitioning means mounted substantially upright to a contact slide surface between the squeegee and the screen, and a coating agent leakage prohibiting means provided to both ends of said squeegee and having a coating agent control guide inclined towards the center of a printing sphere as defined by the width of the squeegee. The coating agent leakage prohibiting means has a site of contact with the screen fitted with an elastic material. The partitioning means prevents the cream solder from becoming twisted between the screen and the squeegee with a sliding movement of the squeegee and from being moved in fluidity on the screen in a direction substantially at right angles to the sliding direction. The solder leakage prohibiting guides prevent the cream solder from leaking in fluidity to outside a printing sphere determined by the squeegee width.

The squeegee and/or the coating agent control guide are preferably of a curved surface facing a printing area with a curved surface. The partitioning means is preferably inclined at a preset angle relative to the sliding direction. The elastic member may be of a resin material.

In the screen printing apparatus of the present invention, cream solder is used as a coating agent, while a circuit substrate is used as a substrate. The screen printing apparatus of the present invention is used for printing cream solder on a printed wiring board.

In the screen printing apparatus of the present invention, in which the squeegee is provided with the partitioning means and with the coating agent leakage prohibiting means, it becomes possible to prevent the phenomenon in which the coating agent becomes twisted between the screen and the squeegee to pass in fluidity on the screen in a direction substantially at right angles to the sliding direction to leak out to outside the printing sphere externally of the squeegee width. Since the solder leakage prohibiting guides are provided to the coating agent leakage prohibiting means, the coating agent, affixed to the inner lateral side of the coating leakage prohibiting means, is returned to the printing sphere when the squeegee is uplifted on termination of the printing, so that there is no risk of the coating agent, sandwiched between the coating agent leakage prohibiting means and the screen, leaking to outside the printing sphere when the squeegee descends for the next printing. This reduces the cost incurred by the coating agent not used for printing and discarded as being unusable.

Moreover, if, with the screen printing apparatus of the present invention, the squeegee and/or the coating agent control guide includes curved surfaces facing the printing sphere with concave surfaces, the coating agent may be returned to the printing sphere more smoothly.

Furthermore, if, with the screen printing apparatus of the present invention, the partitioning means is inclined at a preset angle relative to the sliding direction, and the squeegees facing each other are reciprocated on the screen to force the coating agent onto the substrate, the coating agent that becomes twisted between the squeegees, is rendered uniform in the printing sphere to remove patches in coating.

Other objects and advantages of the present invention will become more apparent from the following explanation of preferred embodiments, which will now be made with reference to the drawings.

BEST MODE FOR CARRYING OUT THE INVENTION

A screen printing apparatus, embodying the present invention is a cream solder printing apparatus for a printed wiring board for applying cream solder to a land for connection of an interconnect pattern on a circuit substrate, and it is a mechanism for reducing the amount of runover of the solder to outside the printing sphere from both ends of the squeegee of the cream solder printing apparatus. In the present embodiment, twisting of the solder between the squeegee and the screen and the flowing thereof to outside the printing area by the sliding motion of the squeegee may be controlled by the comb blade members. In addition, a solder leakage prohibiting guide is provided on each side of the squeegee, and a solder control guide is provided to the solder leakage prohibiting guide to shift an end part of the solder on elevation of the squeegee towards the printing area, such as to prevent the solder affixed to the solder leakage prohibiting guide from leaking to outside the printing area.

Figure 1:
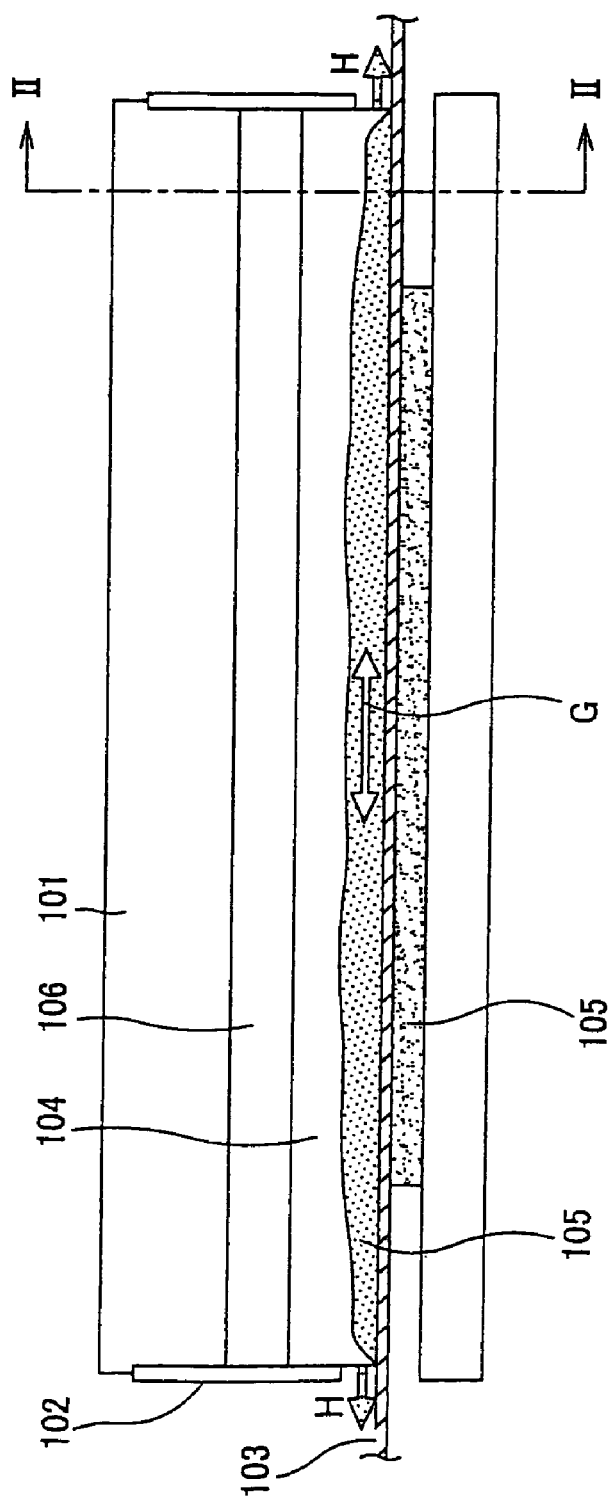
FIG. 1 is a front view showing a squeegee part of a conventional screen printing apparatus.
Figure 4:
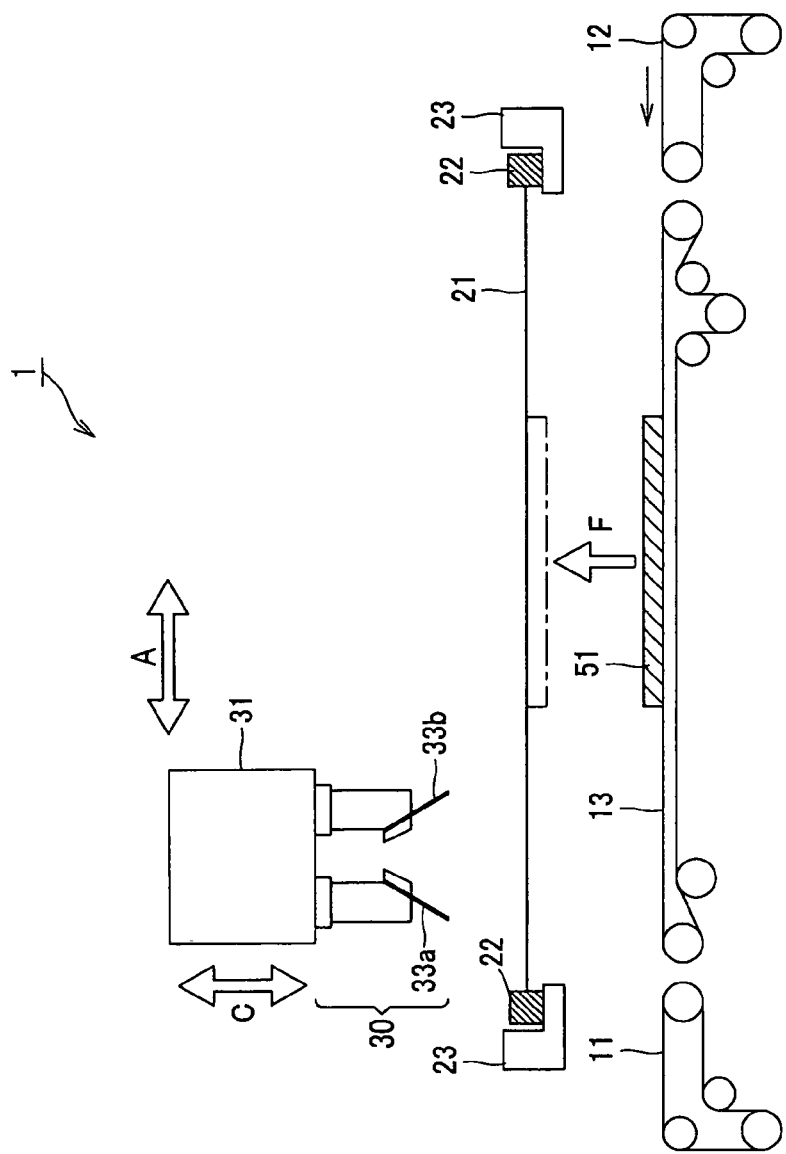
FIG. 4 is a side view showing a cream solder printing apparatus according to the present invention.
Figure 5:
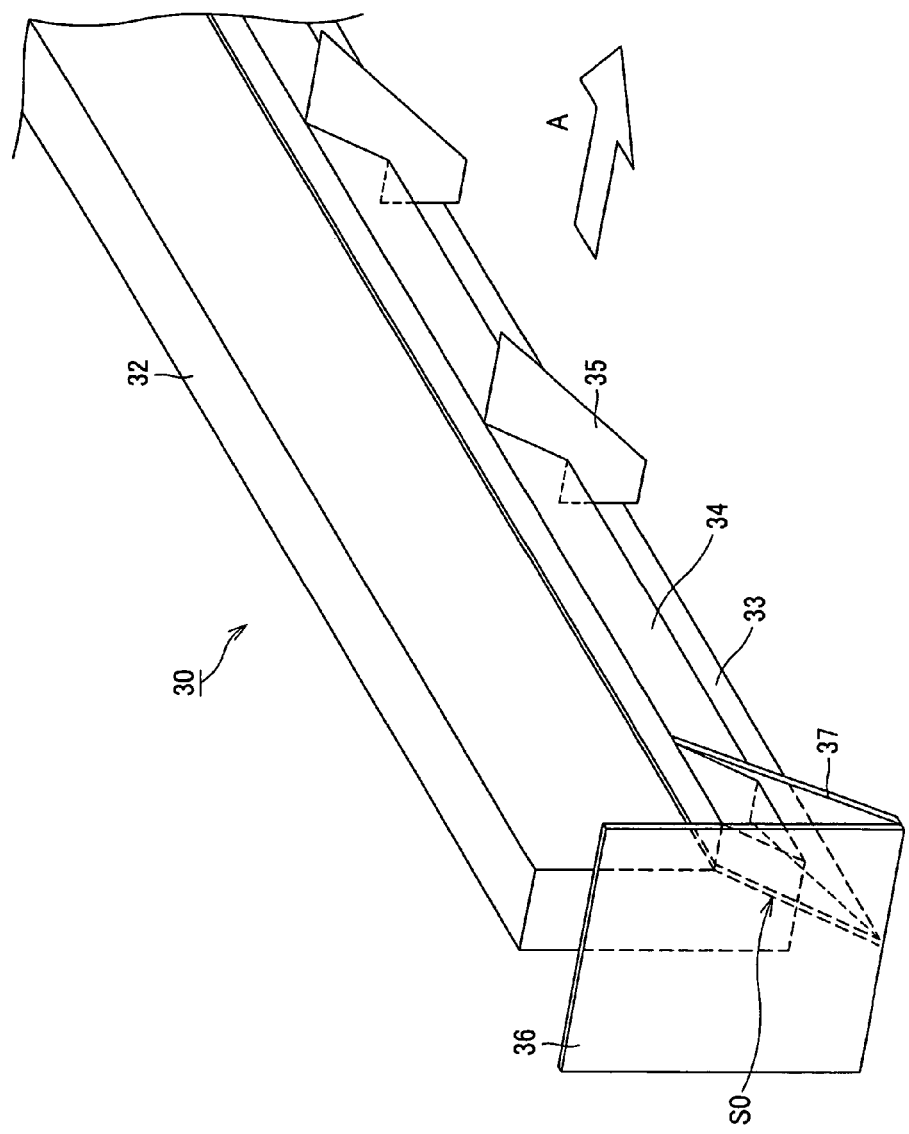
FIG. 5 is a perspective view showing a squeegee assembly as used in the cream solder printing apparatus.

Referring to the drawings, a cream solder printing apparatus 1 according to the present invention will be explained in detail. The smallest essential portions of the screen printing apparatus of the present invention, shown in FIG. 4, are shown in FIG. 1. The cream solder printing apparatus 1 includes a delivery conveyor 11, a conveyor belt 12 and a discharge conveyor 13, as a structure for delivery of a circuit substrate 51 into the inside of the cream solder printing apparatus 1 and discharge thereof out of the apparatus. The apparatus also includes a screen 21, a frame 22 for securing the screen 21, another frame 23 for supporting the frame 22, a base 31, having movable parts, and a squeegee assembly 30, provided with squeegees 33a, 33b, which are provided facing each other at both ends of the base, as a mechanism for printing the cream solder on a circuit substrate.

The operation of the cream solder printing apparatus 1, constructed and designed as described above, now will be explained. Initially, the delivery conveyor 11 and the conveyor belt 12, shown in FIG. 4, are actuated for introducing the circuit substrate 51 onto the conveyor belt to halt the circuit substrate at a preset location. The conveyor belt 12 is halted simultaneously. The circuit substrate 51 then is adjusted and corrected in its position and raised in the direction indicated by arrow F in FIG. 4 until the screen 21 is contacted with the circuit substrate 51. In this state, the squeegees 33a, 33b are caused to sweep on the screen in the direction indicated by arrow F in FIG. 4 to print a cream solder 52. After the end of the sequence of the printing operations, the circuit substrate 51 is separated from the screen 21 and lowered as far as the conveyor belt 12, which conveyor belt 12 is then actuated together with the discharge conveyor 13 to eject the circuit substrate 51 for which the solder printing has come to a close.

Figure 2:
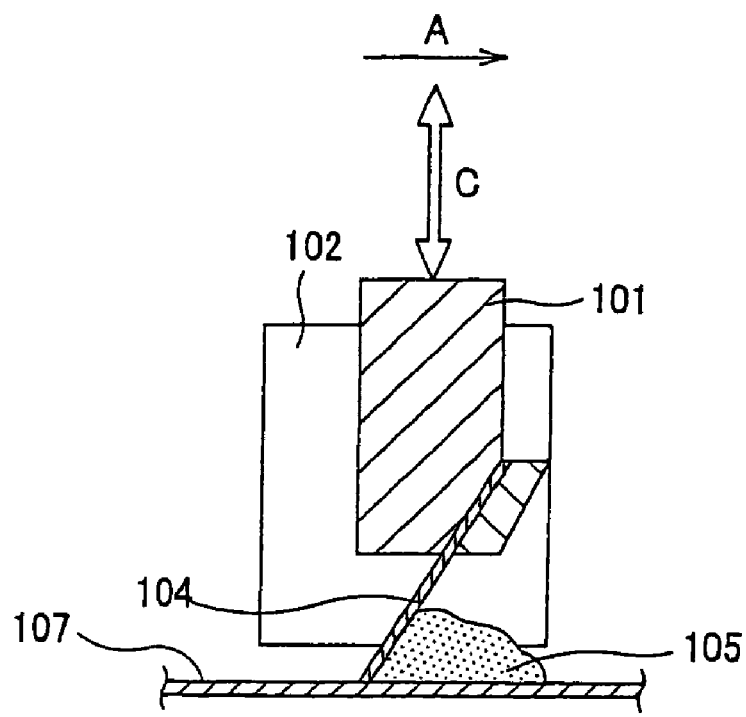
FIG. 2 is a cross-sectional view taken along line II-II of FIG. 1.
Figure 3:
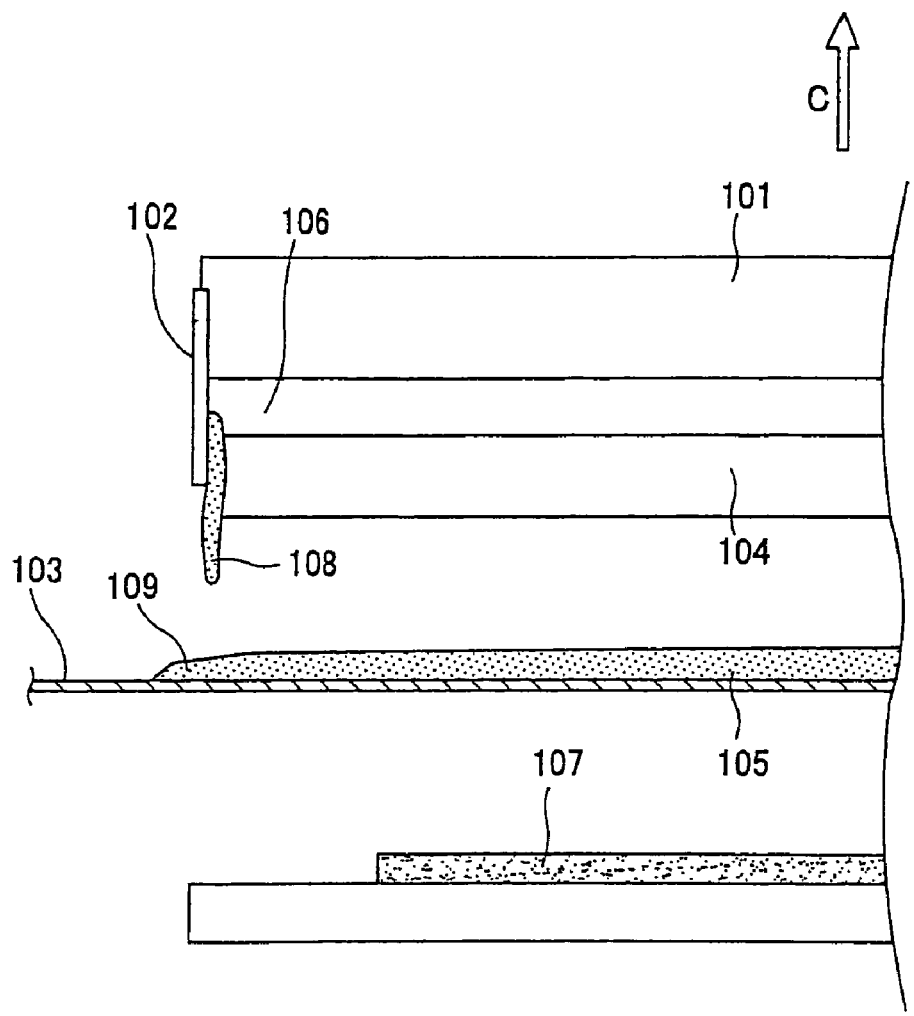
FIG. 3 is a side view showing the state in which solder becomes affixed to the inner lateral side of a solder leakage guide when uplifting the squeegee on the termination of printing by the conventional screen printing apparatus.

The squeegee assembly 30 of the present invention now will be explained with reference to FIGS. 5 to 9. The squeegee assembly 30 represents an essential component for applying the cream solder to the circuit substrate, and it includes a squeegee holder 32, a squeegee 33 and a squeegee retainer 34. The squeegee holder 32 includes an inclined surface S0 along the sliding direction indicated by arrow A in FIG. 5. The squeegee 33 is mounted on this inclined surface S0 by the squeegee retainer 34. The squeegee assembly 30 is mounted via a driving part to the main body unit of the cream solder printing apparatus, in a manner not shown. During the sliding movement, the squeegee 33 is thrust under a preset pressure against the screen 21. Hence, the squeegee 33 is thrust at a preset angle of inclination under a preset pressure as it is sweeps on the screen 21 in the direction indicated by arrow A in FIG. 2.

When the squeegee assembly 30 is driven, the squeegee 33 is slid on the screen to stretch the cream solder 52, which is supplied to the screen 21, on the screen 21 by the squeegee 33, so as to be applied to the circuit substrate 51 arranged in contact with the underside of the screen 21 through the opening in the screen 21.

According to the present invention in particular, there are provided a plural number of, herein three, comb blade members 35 and a plural number herein two, of end solder leakage prohibiting guides 36 in the squeegee assembly 30 of the cream solder printing apparatus 1. The comb blade members 35 partition the cream solder 52 on the screen 21 into plural sections in a direction substantially perpendicular to the contact slide surface of the squeegee 33 and the screen 21, in order to control the phenomenon in which the cream solder 52 becomes twisted between the screen 21 and the squeegee 33 with the sliding of the squeegee 33 to flow in the direction substantially at right angles to the sliding direction on the screen 21, as indicated by arrow B in FIG. 6.

Figure 8:
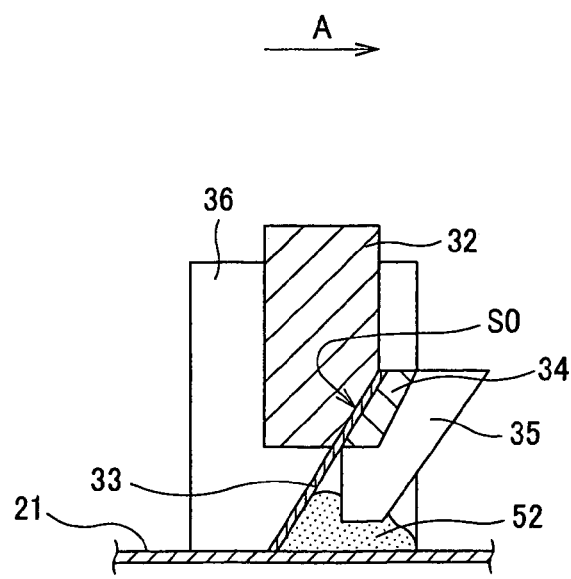
FIG. 8 is a cross-sectional view taken along line VIII-VIII of FIG. 6.

The comb blade members 35 are provided so as to leave a small clearance between it and the screen 21, as shown in FIG. 8. The reason is that, if the comb blade members 35 are contacted with the screen 21, printing is inhibited where there is a screen opening directly below the comb blade member 35. Even if a design is made so that no screen opening is provided directly below the comb blade member 35, it becomes necessary to control the amount of cream solder supplied from one partition to another. It is because the amount of cream solder 52 used (consumed) differs depending on the area of the screen opening, so that, in case the partitioning provides for complete closure, that is, in case the comb blade members 35 are designed to sweep in sliding contact with the screen 21, it becomes necessary to control the supply quantity of the cream solder from one section to another. Hence, it is necessary to provide a spacing between the comb blade members 35 and the screen 21 via which the cream solder 52 may flow between the partitions, as the cream solder is suppressed from flowing to outside the printing area. Meanwhile, the number of the comb blade members 35 is not limited to three as shown.

Figure 6:
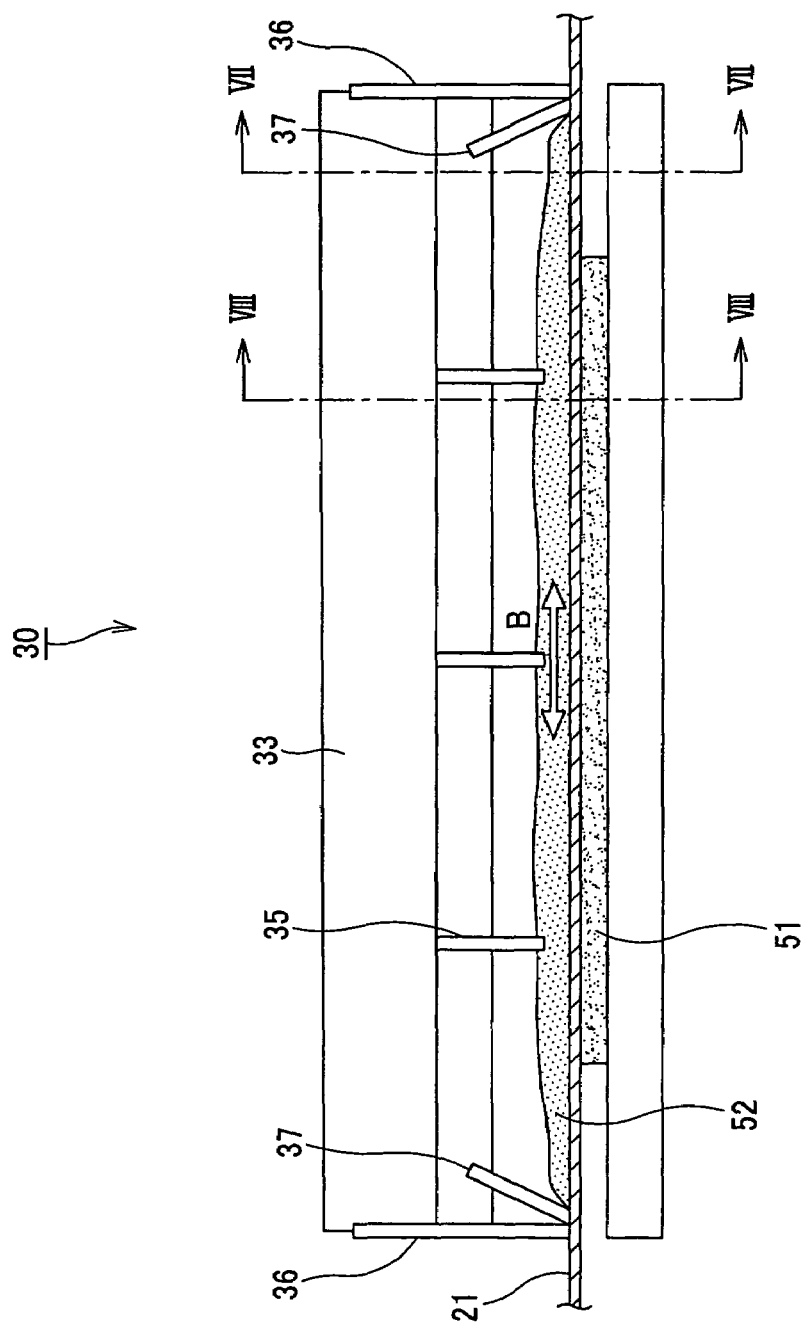
FIG. 6 is a front view showing the squeegee assembly from the sliding direction.
Figure 9:
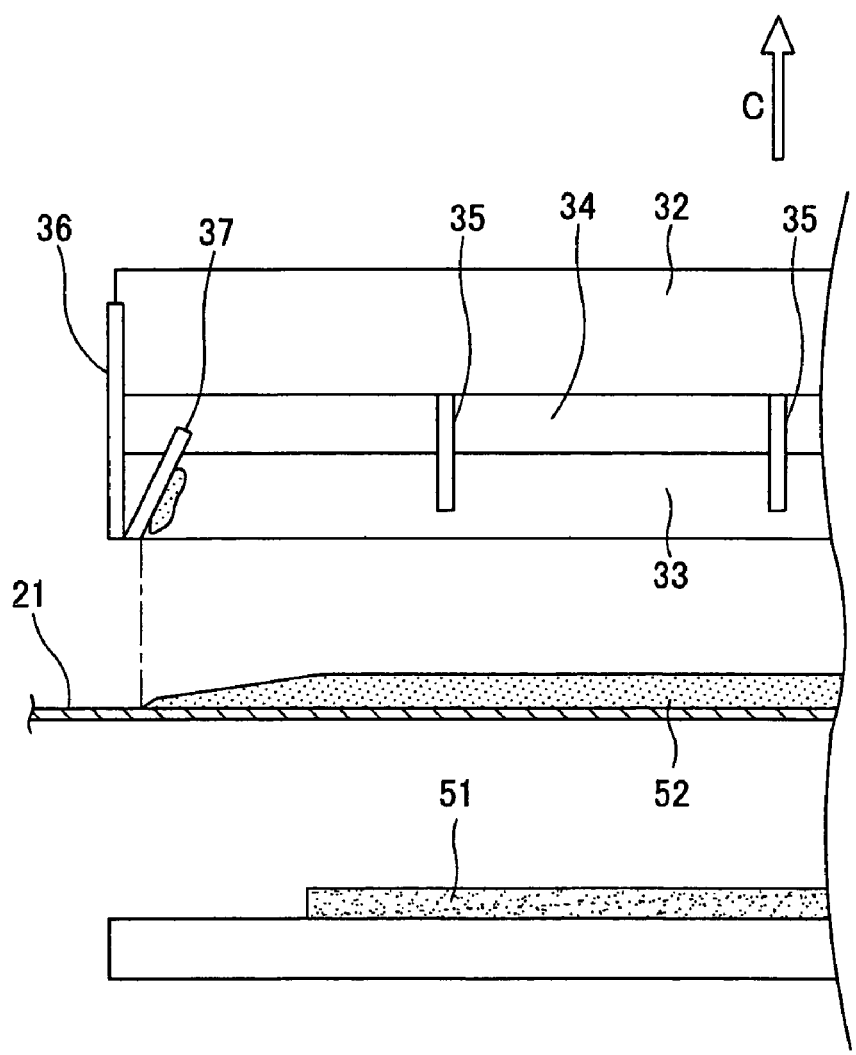
FIG. 9 is a side view showing the state of the cream solder affixed to a solder control guide when the squeegee is raised in its position.

The solder leakage prohibiting guides 36 are provided at both ends of the squeegee 33 and are each provided with a solder control guide 37. Since the solder control guide 37 is inclined towards inside, that is, towards the center of the printing area delimited by the width of the squeegee, with respect to a normal line drawn to the planar surface of the screen 21, as shown in FIGS. 6 and 9, the cream solder 52, moved in fluidity in the direction indicated by arrow B in FIG. 6, is pushed back by this solder control guide 37 towards the printing area, so as to prevent the cream solder 52 from leaking to outside the printing area externally of the squeegee width. In addition, when the squeegee is uplifted in the direction indicated by arrow C, the solder which has become affixed to the inner lateral side of the solder control guide is returned by the solder control guide 37, so as to be accumulated to a low height within the printing area. Hence, there is no risk that, when the squeegee performs a downward movement for the next printing, the cream solder is captured between the solder leakage prohibiting guides 36 and the screen 21 to leak out of the printing sphere.

It is noted that the contact site of the solder leakage prohibiting guides 36 with the screen 21 is protected by an elastic material. In this manner, not only is the surface of the screen 21 not damaged on contact with the solder leakage prohibiting guides, but also the elastic material is intimately contacted with and slides in intimate contact with the screen 21, by the squeegee assembly 30 being thrust under a preset pressure, with the result that there is no room for leakage of the cream solder 52.

Figure 10:
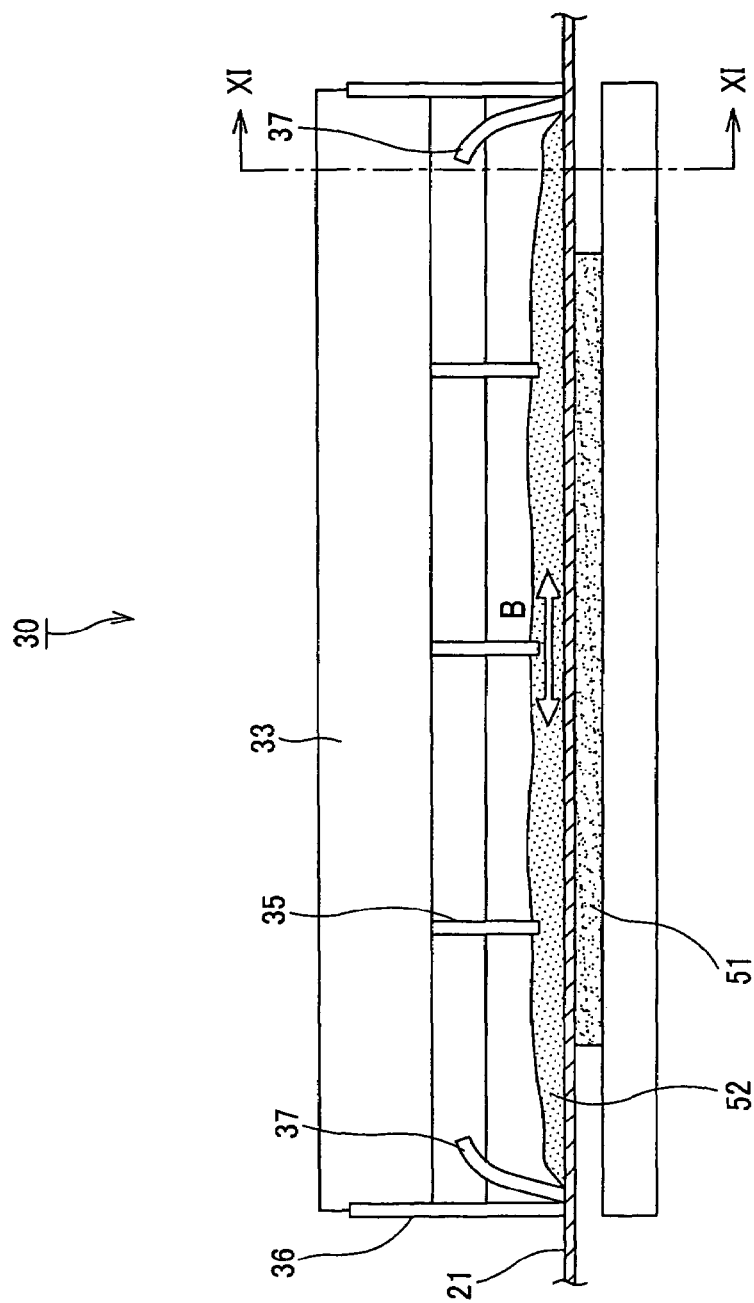
FIG. 10 is a front view showing a modified squeegee assembly of the present invention from the sliding direction.
Figure 11:
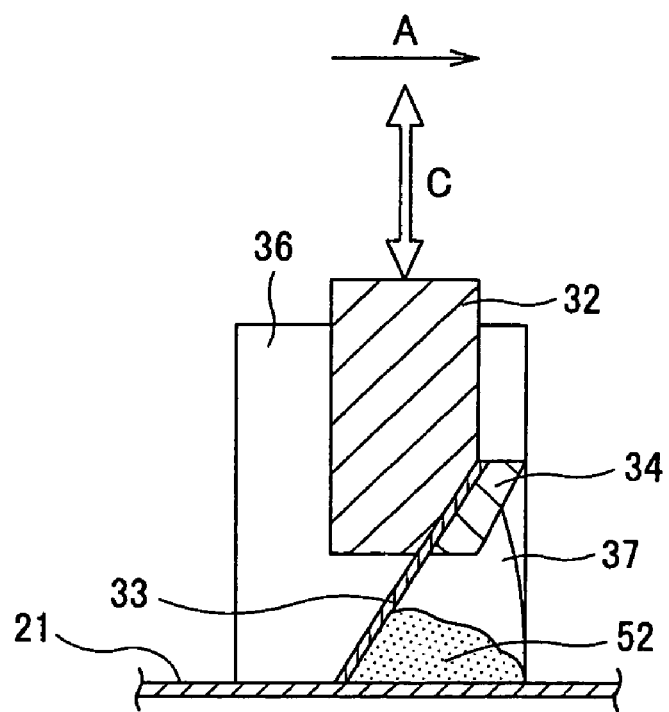
FIG. 11 is a cross-sectional view taken along line XI-XI of FIG. 10.

According to the present invention, the solder control guide 37 and the squeegee 33 may present curved surfaces facing each other with concave facing sides in the printing sphere, as shown in FIGS. 10 and 11. The curved surfaces may be designed so as to eliminate an angle defined between the squeegee 33 and the squeegee retainer 34, that is, an angle defined between the surfaces S1 and S2, as shown in the side view of FIG. 7. By so doing, it is possible to avoid the apparatus becoming substantially unusable by providing for a better state of twisting of the cream solder and by preventing the cream solder 52 from being accumulated in a space created by the squeegee 33 and the squeegee retainer 34, that is, between the surfaces S1 and S2 in FIG. 7.

Figure 7:
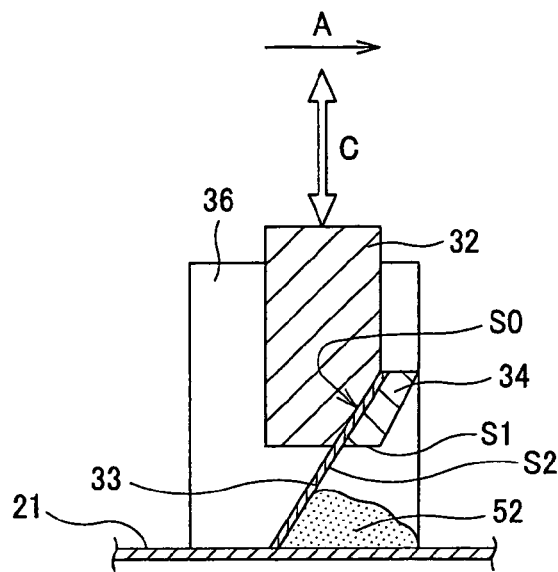
FIG. 7 is a cross-sectional view taken along line VII-VII of FIG. 6.
Figure 12:
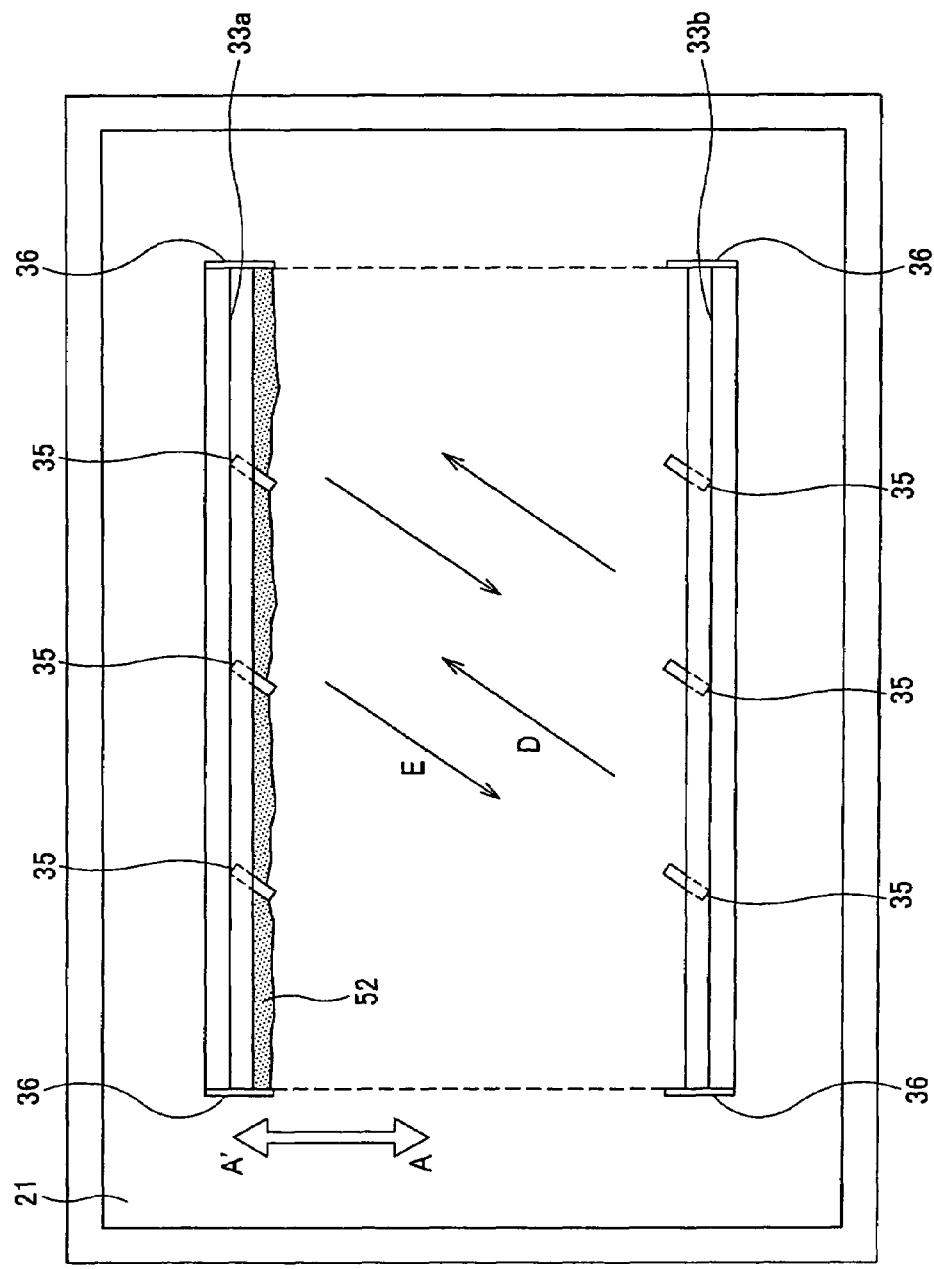
FIG. 12 is a cross-sectional side view showing the flowing state of the cream solder in a case where comb blade members are tilted a preset angle relative to the sliding direction as indicated by arrow A in FIGS. 7 and 8.

The comb blade members 35 may be angled, that is, inclined, at a preset angle relative to the sliding direction indicated by arrow A in FIGS. 7 and 8. In particular, if the squeegees 33a, 33b are provided facing each other to perform printing as the squeegees perform reciprocating movement, and if the comb blade members 35 are inclined at a preset angle with respect to the sliding direction, as indicated in FIG. 4, the cream solder, subjected to a twisting movement between the squeegees, passes in fluidity in the directions indicated by arrows D or E in FIG. 12 when the squeegee assembly 30 is reciprocated in the directions indicated by arrows A and A' in FIG. 12, with the result that the cream solder may be rendered uniform in the printing sphere to remove the risk of the cream solder being supplied in irregular quantities.

According to the cream solder printing apparatus 1 of the present invention, in which it is possible to prevent leakage of the solder to outside the printing sphere, it is possible to reduce the wasteful cost incurred by the cream solder which has so far been discarded because it has become oxidized and unusable for printing.

It is to be noted that the present invention is not limited to the embodiments described above with reference to the drawings, and various changes, substitutions or equivalents may be attempted within the scope of the invention as defined in the claims.

INDUSTRIAL APPLICABILITY

The present invention may be applied to any apparatus for screen printing in which a coating agent is supplied to a printing opening in a screen by a slide movement of the squeegee for printing on a substrate provided in contact with the underside of the screen, without being limited by the type of the coating agent or the mode of the substrate.

The invention claimed is:

1. A screen printing apparatus in which a squeegee mounted at an angle with respect to the sliding direction is slid on a screen to force a paste-like coating agent, supplied on said screen, to a substrate provided in contact with the underside of said screen, via an opening formed in said screen, said apparatus comprising;
   at least one partitioning means mounted substantially upright to a contact slide surface between said squeegee and said screen; and
   coating agent leakage prohibiting means provided to both ends of said squeegee and having a coating agent control guide including a panel portion with bottom edge extending perpendicularly from the squeegee and parallel to the sliding direction, the panel portion extending from the bottom edge and inclined inwardly relative to a normal line to the surface of said screen towards the center of a printing sphere as defined by a width of said squeegee, said coating agent leakage prohibiting means having a site of contact with said screen protected with an elastic material.

2. The screen printing apparatus according to claim 1 wherein said coating agent is a cream solder and wherein said substrate is a circuit substrate.

3. The screen printing apparatus according to claim 1 wherein said squeegee and/or said coating agent control guide include curved surfaces facing said printing sphere with concave surfaces.

4. The screen printing apparatus according to claim 1 wherein said squeegee and/or said partitioning means are inclined at a preset angle relative to the sliding direction.

* * * * *